(12) United States Patent
Carson

(10) Patent No.: US 9,927,485 B2
(45) Date of Patent: *Mar. 27, 2018

(54) ENHANCED AWG WAVEFORM CALIBRATION USING S-PARAMETERS

(75) Inventor: John E. Carson, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 749 days.

This patent is subject to a terminal disclaimer.

(21) Appl. No.: 13/243,163

(22) Filed: Sep. 23, 2011

(65) Prior Publication Data

US 2013/0080106 A1 Mar. 28, 2013

(51) Int. Cl.
*G01D 18/00* (2006.01)
*G01R 31/28* (2006.01)

(52) U.S. Cl.
CPC .................. *G01R 31/2841* (2013.01)

(58) Field of Classification Search
CPC ..................................... G01R 31/2841
USPC ....................................... 702/104
See application file for complete search history.

(56) References Cited

U.S. PATENT DOCUMENTS

| 7,256,585 | B1 * | 8/2007 | Shoulders | G01R 27/04 |
| | | | | 324/601 |
| 2008/0048677 | A1 * | 2/2008 | Tan | G01R 35/005 |
| | | | | 324/638 |
| 2008/0265911 | A1 | 10/2008 | Breakenridge | |
| 2009/0052556 | A1 | 2/2009 | Fernandez | |
| 2009/0195498 | A1 | 8/2009 | Karapattu et al. | |
| 2010/0283894 | A1 * | 11/2010 | Horan | H04L 25/02 |
| | | | | 348/441 |
| 2011/0254721 | A1 | 10/2011 | Sakai | |

FOREIGN PATENT DOCUMENTS

| DE | 19723087 A1 | 2/1998 |
| JP | 2008286699 A | 11/2008 |

OTHER PUBLICATIONS

Anonymous: "Creating Calibrated UWB WiMedia Signals, Application Note", 2008, pp. 1-12, XP002692222, Retrieved from the Internet: URL: http://www.tek.com/document/application-note/creating-calibrated-uwb-wimedia-signals, retrieved on Jan. 8, 2013.

Mercade, J: "DAC Interleaving in Ultra-High-Speed Arbs", Evaluation Engineering, Dec. 2009, pp. 14-22, XP002690094, Retrieved from the Internet: URL: http://www.arbitrary.es/Files/EE_hs_arbs.pdf, retrieved on Jan. 8, 2013.

European Search Report and Written Opinion for Application No. 12183019.4, dated Feb. 15, 2013, 9 pages.

Williams et al., "Terminology for High-Speed Sampling—Oscilloscope Calibration", ARFTG Conference Digest, December 2006, 6 pages.

* cited by examiner

*Primary Examiner* — Hyun Park

(74) *Attorney, Agent, or Firm* — Marger Johnson; Andrew J. Harrington

(57) ABSTRACT

Embodiments of the present invention provide enhanced methods of calibrating arbitrary waveform generators using s-parameters, and arbitrary waveform generators calibrated according to those methods. Methods are provided for calibrating a single, non-interleaved channel of an arbitrary waveform generator, calibrating multiple interleaved channels, and calibrating pairs of channels, both interleaved and non-interleaved, to generate differential signals.

6 Claims, 8 Drawing Sheets

ENHANCED AWG WAVEFORM CALIBRATION USING S-PARAMETERS

FIELD OF THE INVENTION

The present invention relates to test and measurement instruments, and more particularly to the calibration of arbitrary waveform generators.

BACKGROUND OF THE INVENTION

Arbitrary Waveform Generators (AWGs) are test and measurement instruments that are used to generate analog signals having virtually any waveshape. In operation, a user defines a desired analog signal point-by-point as a series of digital values. An AWG then "plays out" the digital values using a precision digital-to-analog converter to provide the analog signal. AWGs such as the AWG7000 Arbitrary Waveform Generator Series available from Tektronix, Inc, of Beaverton, Oreg. are used for wideband signal generation applications, receiver stress testing of high-speed serial data, and other applications where complex signal creation is required.

For various reasons, the measured frequency characteristics of signals produced by AWGs sometimes differ from the frequency characteristics of their input waveform data. Calibration techniques have been proposed to correct the output responses of AWGs, however, none of them has proven entirely satisfactory.

Thus, there exists a need for enhanced methods of calibrating AWGs.

SUMMARY OF THE INVENTION

Embodiments of the present invention provide enhanced methods of calibrating arbitrary waveform generators using s-parameters, and arbitrary waveform generators calibrated according to those methods. Methods are provided for calibrating a single, non-interleaved channel of an arbitrary waveform generator, calibrating multiple interleaved channels, and calibrating pairs of channels, both interleaved and non-interleaved, to generate differential signals.

The objects, advantages, and other novel features of the present invention are apparent from the following detailed description when read in conjunction with the appended claims and attached drawings.

DETAILED DESCRIPTION OF THE INVENTION

1. Accounting for Reflected Waves

The inventor has recognized that AWGs appear to have imperfect output responses because prior AWG calibration techniques have not taken into account the interaction of reflected waves between the AWG and the measurement instrument during calibration, or between the AWG and the device under test (DUT) during use.

Accordingly, embodiments of the present invention provide methods of calibrating a channel of an AWG, and arbitrary waveform generators calibrated according to those methods, that take into account not only the output response of the channel, but also the interaction of reflected waves between the AWG and a measurement instrument during calibration, and between the AWG and the DUT during use.

Figure 1:
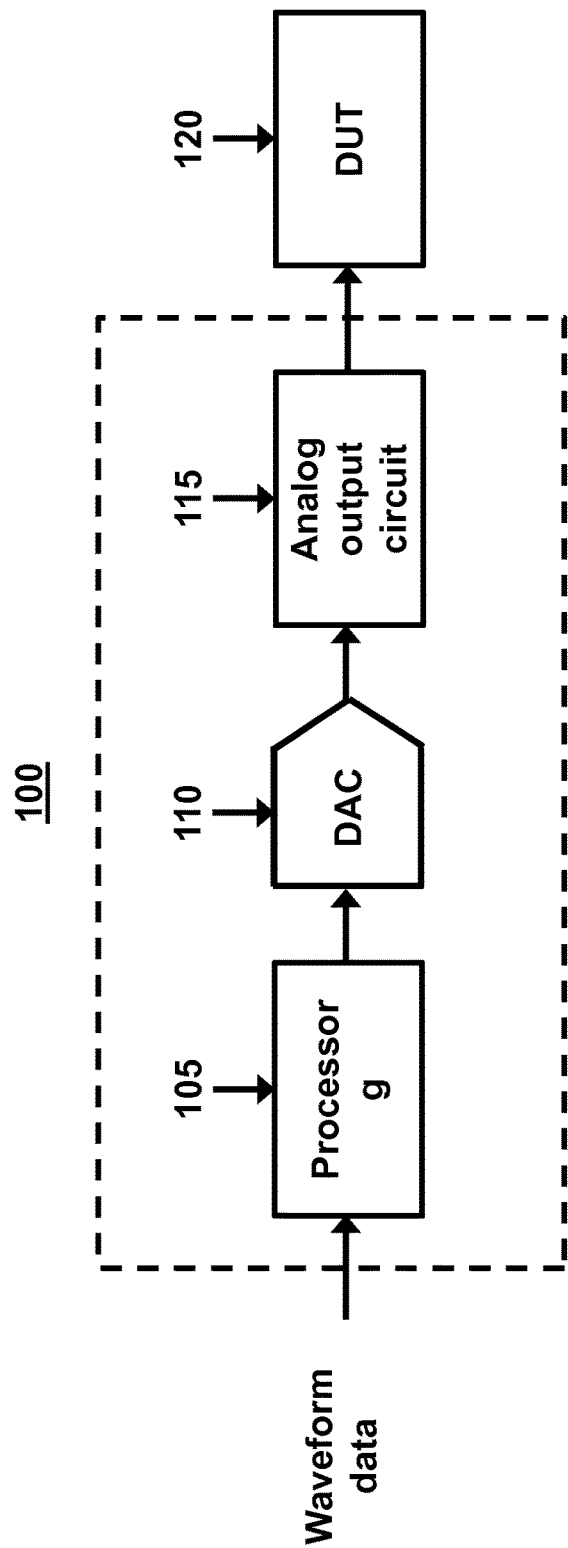
FIG. 1 depicts a simplified, high-level block diagram of an arbitrary waveform generator according to a first embodiment of the present invention.

FIG. 1 depicts an AWG 100 having a single, non-interleaved channel according to an embodiment of the present invention. In operation, a processor 105 receives waveform data that describes a desired output analog signal. The waveform data may be received from a memory, a storage device, or the like. The processor 105 may be implemented as software running on a general-purpose microprocessor, a dedicated application specific integrated circuit (ASIC), a field programmable gate array (FPGA), or the like. The processor 105 applies a correction filter g to the waveform data in order to correct the output response of the channel. The correction filter g can be applied to the waveform data by convolving the correction filter g with the waveform data in the time domain, or by multiplying them together in the frequency domain. The processed waveform data is converted into an analog signal using a digital-to-analog converter (DAC) 110. The analog signal is filtered by an analog output circuit 115, which may include an amplifier, an attenuator, a switch, a reconstruction filter, and the like. The filtered analog signal is then applied to a DUT 120. "The single, non-interleaved channel" refers to the signal path from the DAC 110 through the analog output circuit 115. In some embodiments (not shown), the DAC 110 provides a differential output. In that case, the two outputs may be considered either a pair of channels or a single differential channel.

Figure 2:
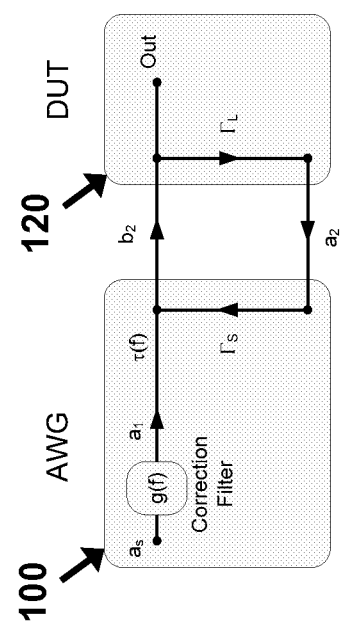
FIG. 2 depicts a first signal flow graph that corresponds to FIG. 1.

In some embodiments, the correction filter g is calculated as follows:

Referring now to FIG. 2, the output response (amplitude and phase) of the channel is measured with a calibrated measurement instrument such as a sampling oscilloscope. The source match, or reflection coefficient, is measured with a calibrated measurement instrument such as a time-domain reflectometer (TDR) or a network analyzer. Together, they form the s-parameters of the source $S_{21s}$ and $S_{22s}$. For clarity later in the analysis, these are written as $\tau$ and $\Gamma_s$ respectively, $$\begin{bmatrix} b_1 \\ b_2 \end{bmatrix} = \begin{bmatrix} 0 & 0 \\ \tau & \Gamma_s \end{bmatrix} \begin{bmatrix} a_1 \\ a_2 \end{bmatrix} \quad \text{(Equation 1)}$$

$S_{11s}$ and $S_{12s}$ equal zero because the input of the DAC is digital in nature, not analog, and thus, no digital data applied to its input can reflect back, and no analog signal applied to its output can pass through to its input.

To complete the analysis, the DUT input reflection coefficient ($\Gamma_L$) must be known. Then, the response equations can be written:

$$b_2 = a_s g \tau + a_2 \Gamma_s \quad \text{(Equation 2)}$$

$$a_2 = b_2 \Gamma_L \quad \text{(Equation 3)}$$

Substituting Equation 3 into Equation 2 yields:

$$b_2 = a_s g \tau + b_2 \Gamma_L \Gamma_s \quad \text{(Equation 4)}$$

Rearranging Equation 4 to solve for $b_2$ yields:

$$b_2 = \frac{a_s g \tau}{1 - \Gamma_L \Gamma_s} \quad \text{(Equation 5)}$$

Substituting Equation 5 into Equation 3 yields:

$$a_2 = \frac{a_s g \tau \Gamma_L}{1 - \Gamma_L \Gamma_s} \quad \text{(Equation 6)}$$

A. Calibration

A calibrated measurement instrument is defined as an instrument that correctly measures the phase and amplitude of the incoming wave from a matched 50 ohm source. Its input is not necessarily matched, and has an input reflection coefficient $\Gamma_L$. Similarly, a calibrated AWG is defined as an AWG that produces an accurate waveform into a matched 50 ohm load and has an output reflection coefficient $\Gamma_s$. In that case, Equation 5 reduces to:

$$b_{2match} = a_s g \tau \quad \text{(Equation 7)}$$

And:

$$\frac{b_{2match}}{a_s} = 1 \quad \text{(Equation 8)}$$

Therefore:

$$g_{match} = \frac{1}{\tau} \quad \text{(Equation 9)}$$

However, when the calibrated instrument and the source are put together (with g=1), the measured result is:

$$b_{2meas} = \frac{a_s \tau}{1 - \Gamma_L \Gamma_s} \quad \text{(Equation 10)}$$

Rearranging Equation 10 yields:

$$\tau = \frac{b_{2meas}}{a_s}(1 - \Gamma_L \Gamma_s) \quad \text{(Equation 11)}$$

Substituting Equation 11 into Equation 9 yields:

$$g_{match} = \frac{1}{\tau} = \frac{a_s}{b_{2meas}(1 - \Gamma_L \Gamma_s)} \quad \text{(Equation 12)}$$

B. Driving a DUT

Now, when a new device is driven with the calibrated source, the resulting forward wave is:

$$b_{2DUT} = \frac{a_s g_{match} \tau}{1 - \Gamma_{LDUT} \Gamma_s} \quad \text{(Equation 13)}$$

Lastly, the DUT input reflection coefficient must be taken into account. The desired output is just $a_s g_{match} \tau$, so the correction filter g is:

$$g = g_{match}(1 - \Gamma_{LDUT} \Gamma_s) \quad \text{(Equation 14)}$$

Where $g_{match}$ represents the correction filter assuming a matched load, $\Gamma_{LDUT}$ represents the input reflection coefficient of the DUT, and $\Gamma_s$ represents the output reflection coefficient of the AWG.

In some embodiments, the DUT input reflection coefficient is an ideal, calculated value, selected so that the correction filter corrects the output response so that it is right when working into a matched 50 ohm load, an open circuit, or any other specified impedance. This correction filter can be generated during manufacturing, stored in the AWG, and used when the DUT s-parameters are not available. In other embodiments, the DUT input reflection coefficient is a measured value by the user, in which case the correction filter corrects the output response so that it is right when working into the DUT.

Although the AWG shown and described above only has a single, non-interleaved channel, it will be appreciated that this same calibration approach can also be used to improve the output response of an AWG having multiple interleaved channels. That is, the output response of an interleaved AWG can be improved by taking into account the interaction of reflected waves between the AWG and the measurement instrument during calibration, and between the AWG and the DUT during use. In that case, the correction filter g developed above can be used as-is, provided that the multiple interleaved channels are treated as a single higher rate non-interleaved channel, and the source match of the channel ($\Gamma_s$) equals the net source match of the arbitrary waveform generator ($S_{net}$), described in detail below.

C. Adding an External Device

Figure 3:
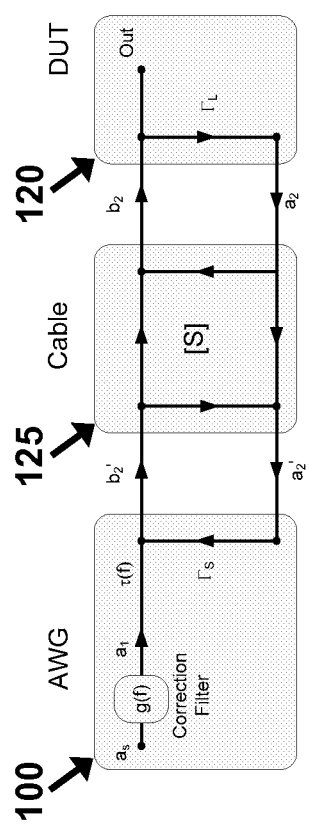
FIG. 3 depicts a second signal flow graph that corresponds to FIG. 1.

Referring now to FIG. 3, when an external device 125 such as a cable, an up-converter, or the like is used between the AWG 100 and the DUT 120, it can be more appropriate to calibrate at the output of the external device 125. In that case, the correction filter g is essentially the same as described above. This is because, when the s-parameters of the external device 125 are cascaded with the source parameters, the form of the new effective source output remains the same because of the two zeros in the first row of the source matrix. The shifted source parameters can be measured directly with the external device 125 in place or calculated using known front panel referenced AWG 100 parameters and external device parameters.

Figure 4:
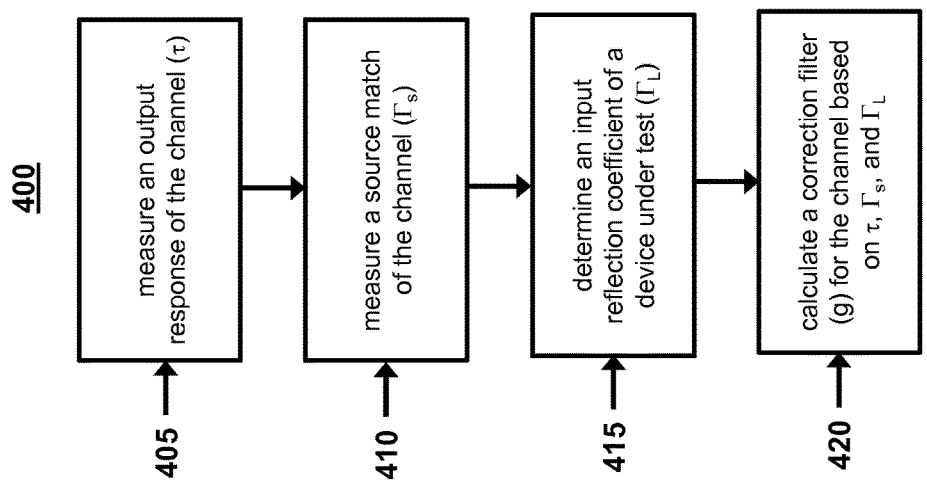
FIG. 4 depicts a method that corresponds to FIG. 1.

FIG. 4 depicts a method 400 of calibrating a channel of an arbitrary waveform generator according to an embodiment of the present invention. In step 405, an output response of the channel is measured ($\tau$). In step 410, a source match of the channel is measured ($\tau_s$). In step 415, an input reflection coefficient of a DUT is determined ($\tau_L$). In step 420, a correction filter (g) for the channel is calculated based on $\tau$, $\Gamma_s$, and $\Gamma_L$. Steps 405, 410, and 415 are not required to be performed in the order shown, but rather can be performed in any order.

2. Correcting Multiple Interleaved Channels

Many AWGs achieve higher samples rate by interleaving multiple channels together. However, when doing so, the resulting output response is more difficult to correct for several reasons. The first reason is that the individual output responses of the interleaved channels will not match, and thus a single correction filter cannot be completely right. The second reason is that the overall output response will be influenced by reflections between the multiple sources, as well as reflections between the multiple sources and the DUT.

Accordingly, embodiments of the present invention provide methods of calibrating multiple interleaved channels of an AWG, and arbitrary waveform generators calibrated according to those methods, that take into account the output response of each interleaved channel, the interaction of reflected waves between the AWG and a measurement instrument during calibration and between the AWG and the DUT during use, or both simultaneously. For reasons that will be explained below, these methods correct the output response of each channel independently, and apply the correction filter to the lower sample rate waveform input to each DAC rather than the full sample rate waveform.

Figure 5:
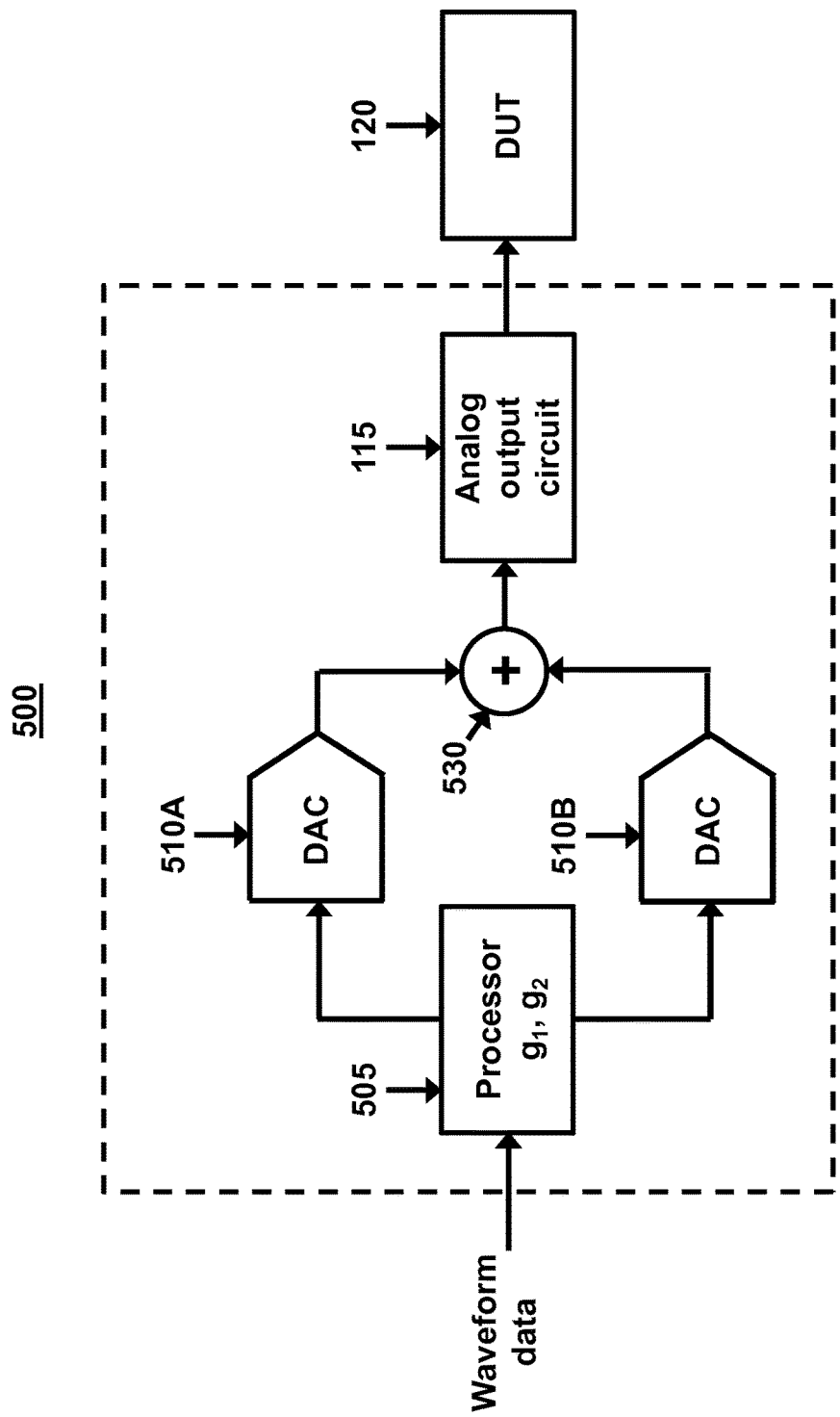
FIG. 5 depicts a simplified, high-level block diagram of an arbitrary waveform generator according to a second embodiment of the present invention.

FIG. 5 depicts an AWG 500 having two interleaved channels according to an embodiment of the present invention. The AWG 500 is similar to the AWG 100, except that it includes two DACs 510A and 510B instead of a single DAC 110, and a combiner 530. The two DACs 510A and 510B are clocked by two clock signals (not shown) that are phase shifted relative to one another by 180 degrees. In operation, the processor 505 separates the waveform data into samples for the first channel and samples for the second channel, and then applies a first correction filter $g_1$ to the samples for the first channel, and applies a second correction filter $g_2$ to the samples for the second channel, $g_1$ and $g_2$ correct the output responses of the first and second interleaved channels, respectively, and also take into account the interaction of reflected waves between the AWG 500 and a measurement instrument during calibration, and between the AWG 500 and the DUT 120 during use. The DAC 510A converts the samples for the first channel into a first analog signal, and the DAC 510B converts the samples for the second channel into a second analog signal. The first and second analog signals are then combined into a single analog signal with the combiner 530, which is any device used to combine analog signals. The resulting analog signal has double the sample rate of either of the individual DACs 510A and 510B. As in the AWG 100, the combined analog signal is then filtered with an analog output circuit 115 and applied to a DUT 120. "The first interleaved channel" refers to the signal path from the processor 505 through the DAC 510A to the analog output circuit 115, and "the second interleaved channel" refers to the signal path from the processor 505 through the DAC 510B to the analog output circuit 115.

Figure 6:
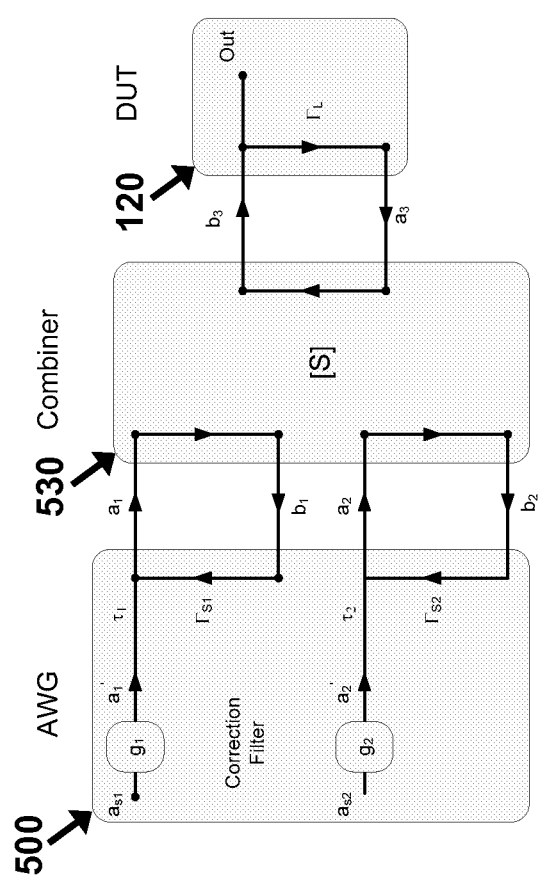
FIG. 6 depicts a first signal flow graph that corresponds to FIG. 5.

In some embodiments, the correction filters $g_1$ and $g_2$ are developed as follows:

The combiner 530 can be any device used to combine analog signals. However, in the following discussion, the combiner 530 is considered to be a symmetric, resistive power combiner. Thus, referring now to FIG. 6, the combiner 530 can be represented by a 3×3 s-parameter matrix:

$$S = \begin{bmatrix} s_{11} & s_{12} & s_{13} \\ s_{21} & s_{22} & s_{23} \\ s_{31} & s_{32} & s_{33} \end{bmatrix} \quad \text{(Equation 15)}$$

In matrix notation, the s-parameter equation is:

$$B = SA \quad \text{(Equation 16)}$$

Where:

$$B = \begin{bmatrix} b_1 \\ b_2 \\ b_3 \end{bmatrix}, \text{ and } A = \begin{bmatrix} a_1 \\ a_2 \\ a_3 \end{bmatrix} \quad \text{(Equation 17)}$$

The solution for the output taking into account the source parameters and the combiner is developed in the Appendix.

$$B = (1 - S\Gamma)^{-1} STA_s \quad \text{(Equation 18)}$$

The difficulty with this approach, however, is that the solution requires knowledge of the details of the reflection and transmission parameters of each channel, along with the two internal ports of the combiner. However, it is very difficult to directly measure individual parameters once the instrument is assembled. If they can be determined at all, it would only be through a complex set of calibration measurements and calculations because the response can only be observed at the output.

Figure 7:
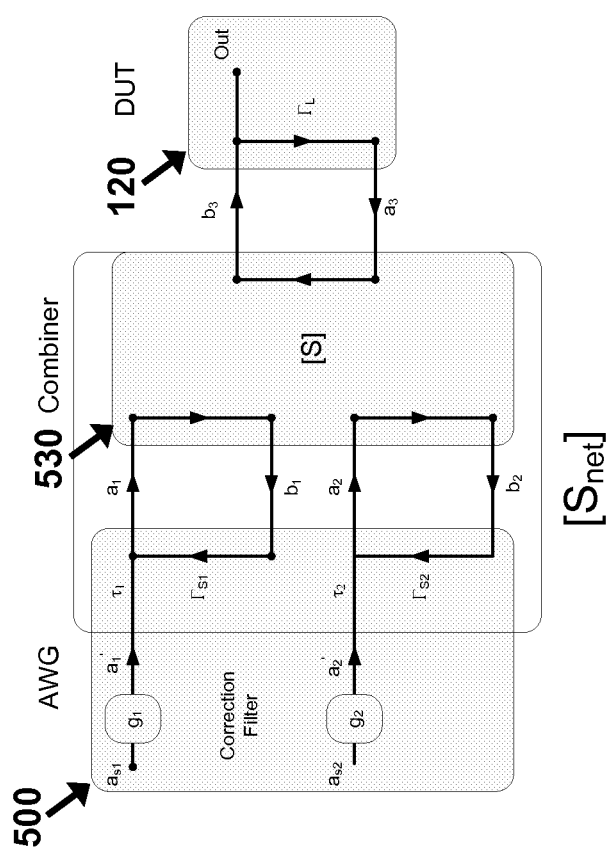
FIG. 7 depicts a second signal flow graph that corresponds to FIG. 5.

On the other hand, if the AWG is viewed from the perspective of the single output port, then the details of the internal interactions are not important. This perspective is depicted in FIG. 7, where the output wave is the sum of the response from each channel to the output, and the DUT 120 interacts with a net single port reflection coefficient at the output port. An overall net three port s-parameter network can be considered to include the DAC outputs, the interconnect, and the combiner. With this simplification, Equations 16 and 17 become:

$$B' = S_{net} A' \quad \text{(Equation 19)}$$

$$B' = \begin{bmatrix} b'_1 \\ b'_2 \\ b'_3 \end{bmatrix}, \text{ and } A' = \begin{bmatrix} a'_1 \\ a'_2 \\ a'_3 \end{bmatrix} = \begin{bmatrix} a_{s1} g_1 \\ a_{s2} g_2 \\ a_3 \end{bmatrix} \quad \text{(Equation 20)}$$

The two source ports are idealized; there are no reflections between the sources and the effective combiner, meaning that $s_{11}$ and $s_{22}$ are zero; and, returning waves $b'_1$ and $b'_2$ are zero, meaning that $s_{12}$, $s_{13}$, $s_{21}$, and $s_{23}$ are all zero. Thus:

$$S_{net} = \begin{bmatrix} 0 & 0 & 0 \\ 0 & 0 & 0 \\ s_{31}^{net} & s_{32}^{net} & s_{33}^{net} \end{bmatrix} = \begin{bmatrix} 0 & 0 & 0 \\ 0 & 0 & 0 \\ \tau_1^{net} & \tau_2^{net} & \Gamma_3^{net} \end{bmatrix} \quad \text{(Equation 21)}$$

Where $\tau_1^{net}$ and $\tau_2^{net}$ are the output responses of the two sources measured through the effective combiner. $\tau_1^{net}$ and $\tau_2^{net}$ are measured "independently," that is, the individual output response of DAC 510A is measured with DAC 510B set to zero, and the individual output response of DAC 510B is measured with DAC 510A set to zero.

We are left with an equation for $b_3$ dependent on the two source waves and the reflection from the load, $a_3$:

$$b_3 = \tau_1^{net} a_{s1} g_1 + \tau_2^{net} a_{s2} g_2 + \Gamma_s^{net} a_3 \quad \text{(Equation 22)}$$

$$a_3 = b_3 \Gamma_L \quad \text{(Equation 23)}$$

Substituting Equation 23 into Equation 22 yields:

$$b_3 = \tau_1^{net} a_{s1} g_1 + \tau_2^{net} a_{s2} g_2 + \Gamma_s^{net} b_3 \Gamma_L \quad \text{(Equation 24)}$$

Rearranging yields:

$$b_3 = \frac{\tau_1^{net} a_{s1} g_1 + \tau_2^{net} a_{s2} g_2}{1 - \Gamma_s^{net} \Gamma_L} \quad \text{(Equation 25)}$$

Equation 25 is the sum of the response from each channel modified by reflections between the output port and load. It is identical to Equation 5 for the single channel case, except that the source transmission is the sum of two sources.

A. Calibration

Now, when working into a matched load, the output is:

$$b_{3match} = \tau_1^{net} a_{s1} g_1 + \tau_2^{net} a_{s2} g_2 \quad \text{(Equation 26)}$$

If the output from each DAC is measured independently with the other DAC set to zero, then the two correction factors are:

$$g_{1match} = \frac{1}{\tau_1^{net}} = \frac{a_{s1}}{b_{3meas}^1 (1 - \Gamma_L \Gamma_s)} \quad \text{(Equation 27)}$$

$$g_{2match} = \frac{1}{\tau_2^{net}} = \frac{a_{s2}}{b_{3meas}^2 (1 - \Gamma_L \Gamma_s)} \quad \text{(Equation 28)}$$

Finally, the output of the calibrated source is:

$$b_3 = (\tau_1^{net} a_{s1} g_{1match} + \tau_2^{net} a_{s2} g_{2match}) \frac{1}{1 - \Gamma_s^{net} \Gamma_{LDUT}} \quad \text{(Equation 29)}$$

B. Driving a DUT

Like the single channel case, if the DUT reflection coefficient is known, then the source waveform can be compensated to correct for it. This part of the correction can be included in a total filter for each DAC or applied to the starting waveform at the full sample rate, since it is the same for both DACs.

$$b = (\tau_1^{net} a_{s1} g_{1match} + \tau_2^{net} a_{s2} g_{2match}) \frac{1}{g_{refl}} \quad \text{(Equation 30)}$$

Where:

$$g_{refl} = 1 - \Gamma_s^{net} \Gamma_{LDUT} \quad \text{(Equation 31)}$$

Thus, the correction filters $g_1$ and $g_2$ are as follows:

$$g_1 = g_{match1} g_{refl} \quad \text{(Equation 32)}$$

$$g_2 = g_{match2} g_{refl} \quad \text{(Equation 33)}$$

Where $g_{match1}$ and $g_{match2}$ represent the first and second correction filters assuming a matched load.

Although the discussion above describes generating two correction filters for a system having two interleaved channels, it will be appreciated that, by applying similar reasoning, additional correction filters can also be developed for systems using higher degrees of interleaving. That is, correction filters can be generated for systems having three interleaved channels, four interleaved channels, and so on. In that case, to generalize the notation for an arbitrary number of interleaved channels, $g_1$, $g_2$, and so on are collectively referred to as $g_n$, and $\tau_1^{net}$, $\tau_2^{net}$, and so on are collectively referred to as $\tau_n^{net}$.

Also, although the correction filters described above simultaneously take into account both the individual output responses of the interleaved channels and the effects of reflections between the DUT and the multiple sources at the same time, correction filters can also be generated that only take into account the individual output responses of the interleaved channels. That is, in some embodiments, an arbitrary waveform generator is calibrated by measuring the output response of each interleaved channel independently and then generating a plurality of correction filters, one for each interleaved channel, based solely on its corresponding measured output response. In that case, each correction filter equals the inverse of its associated measured output response. In other embodiments, the DUT input reflection coefficient and the net source match of the AWG are also measured and used to improve the accuracy of those correction filters.

Figure 8:
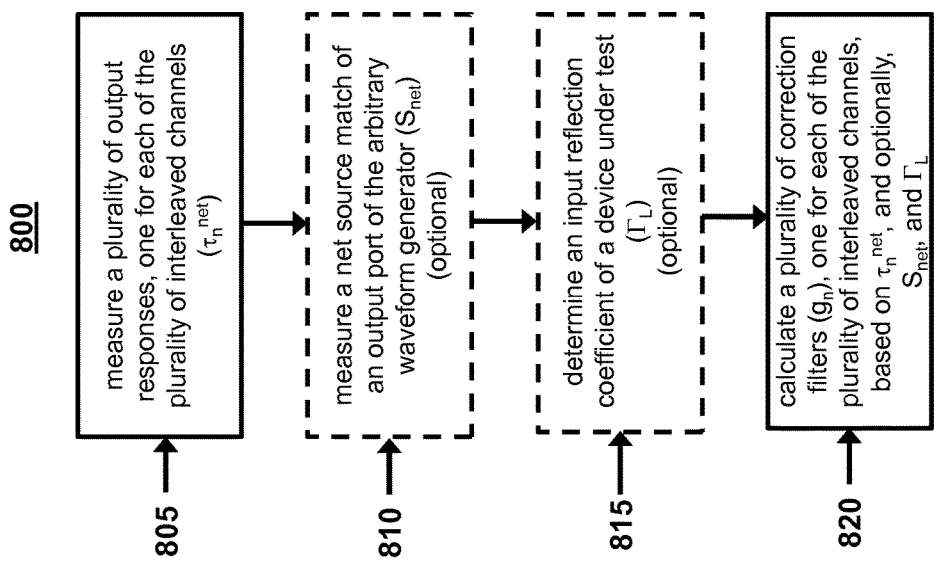
FIG. 8 depicts a method that corresponds to FIG. 5.

FIG. 8 depicts a method 800 of calibrating a plurality of interleaved channels of an arbitrary waveform generator according to an embodiment of the present invention. In step 805, a plurality of output responses, one for each of the plurality of interleaved channels is measured ($\tau_n^{net}$). Optionally, in step 810, a net source match of an output port of the arbitrary waveform generator is measured ($S_{net}$). Optionally, in step 815, an input reflection coefficient of a device under test is determined ($\Gamma_L$). In step 820, a plurality of correction filters ($g_n$) are calculated, one for each of the plurality of interleaved channels, based on $\tau_n^{net}$, $S_{net}$, and $\Gamma_L$. Steps 805, 810, and 815 are not required to be performed in the order shown, but rather can be performed in any order.

3. Correcting Pairs of Channels used to Generate Differential Signals

In some cases, pairs of channels are used to generate differential signals, both pairs of single, non-interleaved channels and pairs of multiple interleaved channels. Each of those channels can be individually calibrated using the techniques described above. Alternatively, the pairs of channels can be calibrated simultaneously using the techniques described above by replacing the single-ended parameters with differential parameters. That is, the single-ended output response of a channel ($\tau$) would be replaced with the differential output response of a pair of single-ended, non-interleaved channels, or the differential output response of a pair of multiple interleaved channels, and so on.

It will be appreciated from the foregoing discussion that the present invention represents a significant advance in the field of test and measurement instruments. Although specific embodiments of the invention have been illustrated and described for purposes of illustration, it will be understood that various modifications may be made without departing from the spirit and scope of the invention. Accordingly, the invention should not be limited except as by the appended claims.

APPENDIX

As defined above, the combiner is represented with a 3 port s-parameter matrix:

$$B = SA \quad \text{(Equation 34)}$$

Where:

$$B = \begin{bmatrix} b_1 \\ b_2 \\ b_3 \end{bmatrix}, \text{ and } A = \begin{bmatrix} a_1 \\ a_2 \\ a_3 \end{bmatrix} \quad \text{(Equation 35)}$$

Given reflection coefficients for the two channels and the load, the elements of A are:

$$a_1 = a_{s1}g_1\tau_1 + \Gamma_{s1}b_1 \quad \text{(Equation 36)}$$

$$a_2 = a_{s2}g_2\tau_2 + \Gamma_{s2}b_2 \quad \text{(Equation 37)}$$

$$a_3 = \Gamma_L b_3 \quad \text{(Equation 38)}$$

Then, Equation 34 can be written:

$$B = ST A_s + ST B \quad \text{(Equation 39)}$$

Where:

$$\Gamma = \begin{bmatrix} \Gamma_{s1} & 0 & 0 \\ 0 & \Gamma_{s2} & 0 \\ 0 & 0 & \Gamma_L \end{bmatrix}, T = \begin{bmatrix} \tau_1 & 0 & 0 \\ 0 & \tau_2 & 0 \\ 0 & 0 & \tau_L \end{bmatrix}, \text{ and} \quad \text{(Equation 40)}$$

$$A_s = \begin{bmatrix} a_{s1}g_1 \\ a_{s2}g_2 \\ a_3 \end{bmatrix}$$

Next, rearrange to solve for B:

$$(1 - S\Gamma)B = STA_s \quad \text{(Equation 41)}$$

$$B = (1 - S\Gamma)^{-1} STA_s \quad \text{(Equation 42)}$$

Equation 42 can be written as a simple matrix equation with $(1-S\Gamma)^{-1}S = K$ $$B = KA_s \quad \text{(Equation 43)}$$

And then:

$$A = S^{-1}KA_s \quad \text{(Equation 44)}$$

Equation 43 solves for all three terms in B, but $b_3$ is the one we are interested in. From Equations 40 and 43 the solution for $b_3$ is:

$$b_3 = k_{31}a_{s1}g_1 + k_{32}a_{s2}g_2 + k_{33}a_3 \quad \text{(Equation 45)}$$

But $a_3$ is just:

$$a_3 = b_3 \Gamma_L \quad \text{(Equation 46)}$$

Which can be substituted into and Equation 43 and solved for $b_3$.

Equation 43 is not quite an s-parameter equation since $b_1$ and $b_2$ are internal and not at the ports where $a_{s1}$ and $a_{s2}$ are defined. However, it suggests that a net effective s-parameter equation can be written.

What is claimed is:

1. A method of calibrating a plurality of interleaved channels of an arbitrary waveform generator comprising the steps of:
measuring a plurality of output responses, one for each of the plurality of interleaved channels ($\tau_n^{net}$);
measuring a net source match of an output port of the arbitrary waveform generator ($S_{net}$);
determining an input reflection coefficient of a device under test ($\Gamma_L$);
calculating a plurality of correction filters ($g_n$), one for each of the plurality of interleaved channels, based on $\tau_n^{net}$, $S_{net}$ and $\Gamma_L$, the calculation including calculating a correction factor ($g_{matchn}$) assuming a matched load for each of the plurality of interleaved channels and calculating a reference correction factor ($g_{refn}$);
applying a respective correction filter of the plurality of correction filters to each of a corresponding plurality of source waveform samples of the waveform generator to produce corrected waveforms; and
outputting the corrected waveforms from the plurality of interleaved channels of the arbitrary waveform generator.

2. A method as in claim 1 wherein each of the plurality of interleaved channels comprises a differential channel.

3. A method as in claim 1 wherein $\Gamma_L$ is an ideal, calculated value.

4. A method as in claim 1 wherein $\Gamma_L$ is a measured value.

5. A method as in claim 1 wherein:
an external device is connected to the output port of the arbitrary waveform generator; and
the calibration is performed at an output port of the external device.

6. An arbitrary waveform generator calibrated according to the method of any of claims 1-5.

* * * * *

UNITED STATES PATENT AND TRADEMARK OFFICE
CERTIFICATE OF CORRECTION

PATENT NO. : 9,927,485 B2  
APPLICATION NO. : 13/243163  
DATED : March 27, 2018  
INVENTOR(S) : John E. Carlson Page 1 of 1

It is certified that error appears in the above-identified patent and that said Letters Patent is hereby corrected as shown below:

On the Title Page

Item (12), the inventor's last name "Carson" should read --Carlson--.

Item (75), the inventor's name "John E. Carson" should read --John E. Carlson--.

Signed and Sealed this
Thirteenth Day of November, 2018

Andrei Iancu
*Director of the United States Patent and Trademark Office*